United States Patent
Tsukioka et al.

(10) Patent No.: US 12,346,014 B2
(45) Date of Patent: Jul. 1, 2025

(54) PROJECTOR

(71) Applicant: SEIKO EPSON CORPORATION, Tokyo (JP)

(72) Inventors: Keita Tsukioka, Matsumoto (JP); Kazunori Maeta, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 461 days.

(21) Appl. No.: 18/075,790

(22) Filed: Dec. 6, 2022

(65) Prior Publication Data

US 2023/0180427 A1 Jun. 8, 2023

(30) Foreign Application Priority Data

Dec. 6, 2021 (JP) .................................. 2021-197580

(51) Int. Cl.
| | |
|---|---|
| G03B 21/16 | (2006.01) |
| H05K 7/20 | (2006.01) |
| G01C 5/06 | (2006.01) |
| G01N 15/08 | (2006.01) |

(52) U.S. Cl.
CPC ......... *G03B 21/16* (2013.01); *H05K 7/20136* (2013.01); *H05K 7/20209* (2013.01); *G01C 5/06* (2013.01); *G01N 2015/084* (2013.01)

(58) Field of Classification Search
CPC . G03B 21/16; H05K 7/20136; H05K 7/20209
See application file for complete search history.

(56) References Cited

U.S. PATENT DOCUMENTS

| | | | | |
|---|---|---|---|---|
| 7,186,290 B2* | 3/2007 | Sheehan | ............ | B01D 46/0028 55/497 |
| 7,527,680 B2* | 5/2009 | Horiguchi | ............ | H04N 9/3144 345/32 |
| 7,535,711 B2* | 5/2009 | Saegusa | ................ | G01P 13/006 353/57 |
| 7,537,348 B2* | 5/2009 | Horiguchi | ............ | H04N 9/3144 353/57 |
| 7,677,962 B2* | 3/2010 | Chang | ................ | H05K 7/20209 361/679.48 |

(Continued)

FOREIGN PATENT DOCUMENTS

| | | |
|---|---|---|
| JP | H06-278453 A | 10/1994 |
| JP | 2009-188040 A | 8/2009 |

*Primary Examiner* — Bao-Luan Q Le
(74) *Attorney, Agent, or Firm* — Dority & Manning, P.A.

(57) ABSTRACT

A projector includes an exterior housing taking in outside air via a filter, a suction fan having an intake opening taking in the outside air, a front chamber communicating with the filter and the intake opening, a pressure sensor placed in the front chamber, and a control unit drive-controlling the suction fan. The control unit executes first measurement processing of activating the suction fan and measuring pressure of the front chamber at a rotation number at the activation by the pressure sensor, second measurement processing of setting a rotation number of the suction fan to a rotation number lower than the rotation number at the activation and measuring the pressure of the front chamber by the pressure sensor, and determination processing of determining clogging of the filter based on a difference between a pressure value of the first measurement processing and a pressure value of the second measurement processing.

8 Claims, 15 Drawing Sheets

(56) References Cited

U.S. PATENT DOCUMENTS

| | | | | |
|---|---|---|---|---|
| 7,997,736 B2* | 8/2011 | Yoshimura | ............ | G03B 21/16 362/345 |
| 8,132,922 B2* | 3/2012 | Yamamoto | ............ | B01D 46/18 353/57 |
| 8,292,980 B2* | 10/2012 | Yamagishi | ............ | H04N 9/3141 96/429 |
| 8,334,783 B2* | 12/2012 | Katayama | ............ | G03B 21/16 340/607 |
| 8,403,498 B2* | 3/2013 | Kotaka | ............ | G03B 21/145 353/55 |
| 8,465,156 B2* | 6/2013 | Nakashita | ............ | G03B 21/16 353/57 |
| 8,562,144 B2* | 10/2013 | Nakajima | ............ | B01D 46/10 353/57 |
| 9,568,814 B2* | 2/2017 | Chen | ............ | G03B 21/16 |
| 10,948,810 B2* | 3/2021 | Miyazaki | ............ | G03B 21/16 |
| 2005/0150382 A1* | 7/2005 | Sheehan | ............ | B01D 46/46 96/429 |
| 2005/0229777 A1* | 10/2005 | Brown | ............ | B01D 46/44 96/417 |
| 2006/0065125 A1* | 3/2006 | Horiguchi | ............ | H04N 9/3144 348/E5.143 |
| 2006/0067049 A1* | 3/2006 | Horiguchi | ............ | H04N 9/3144 348/E5.143 |
| 2007/0207721 A1* | 9/2007 | Chang | ............ | H05K 7/20209 454/184 |
| 2007/0261824 A1* | 11/2007 | Saegusa | ............ | H05K 7/20172 165/129 |
| 2009/0051882 A1* | 2/2009 | Yoshimura | ............ | G03B 21/16 353/57 |
| 2010/0077926 A1* | 4/2010 | Yamagishi | ............ | B03C 3/64 96/423 |
| 2010/0128230 A1* | 5/2010 | Kotaka | ............ | G03B 21/145 353/57 |
| 2010/0277701 A1* | 11/2010 | Yamamoto | ............ | H04N 9/3144 96/423 |
| 2011/0050435 A1* | 3/2011 | Katayama | ............ | G03B 21/16 340/635 |
| 2011/0181845 A1* | 7/2011 | Nakashita | ............ | G03B 21/16 353/58 |
| 2011/0255058 A1* | 10/2011 | Kotani | ............ | B01D 46/185 96/397 |
| 2011/0279788 A1* | 11/2011 | Nakajima | ............ | B01D 46/10 95/1 |
| 2011/0297000 A1* | 12/2011 | Kotani | ............ | B01D 46/681 96/421 |
| 2012/0154694 A1* | 6/2012 | Nishihata | ............ | H04N 9/3144 348/744 |
| 2012/0154762 A1* | 6/2012 | Nishihata | ............ | G03B 21/16 353/58 |
| 2013/0169942 A1* | 7/2013 | Chen | ............ | B01D 33/52 353/52 |
| 2013/0298773 A1* | 11/2013 | Yamagishi | ............ | B01D 46/523 96/15 |
| 2019/0199960 A1* | 6/2019 | Miyazaki | ............ | H04N 9/3144 |

* cited by examiner

FIG. 11 (LOW ALTITUDE: WITHOUT CLOGGING)

FIG. 12 (LOW ALTITUDE: WITH CLOGGING 1)

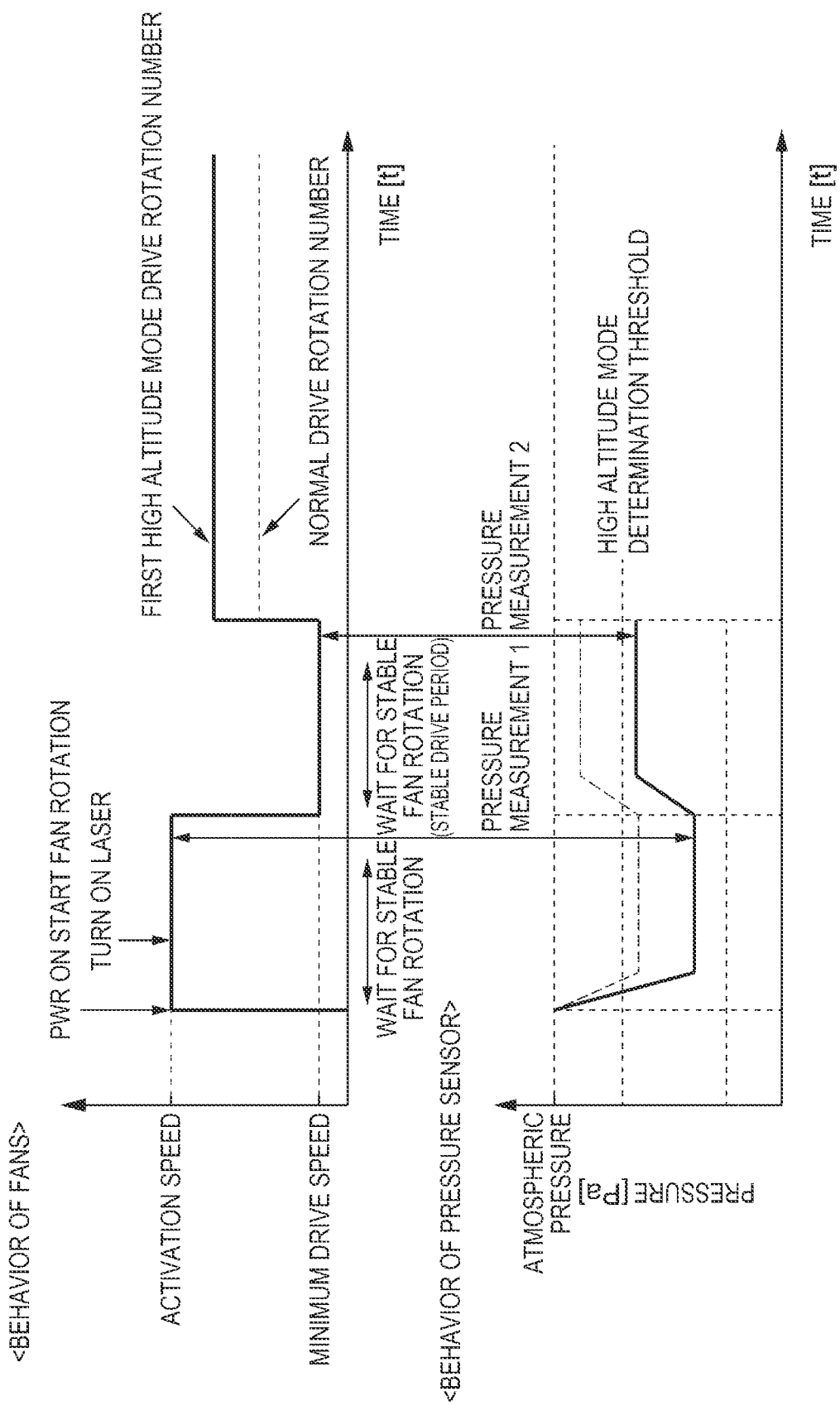

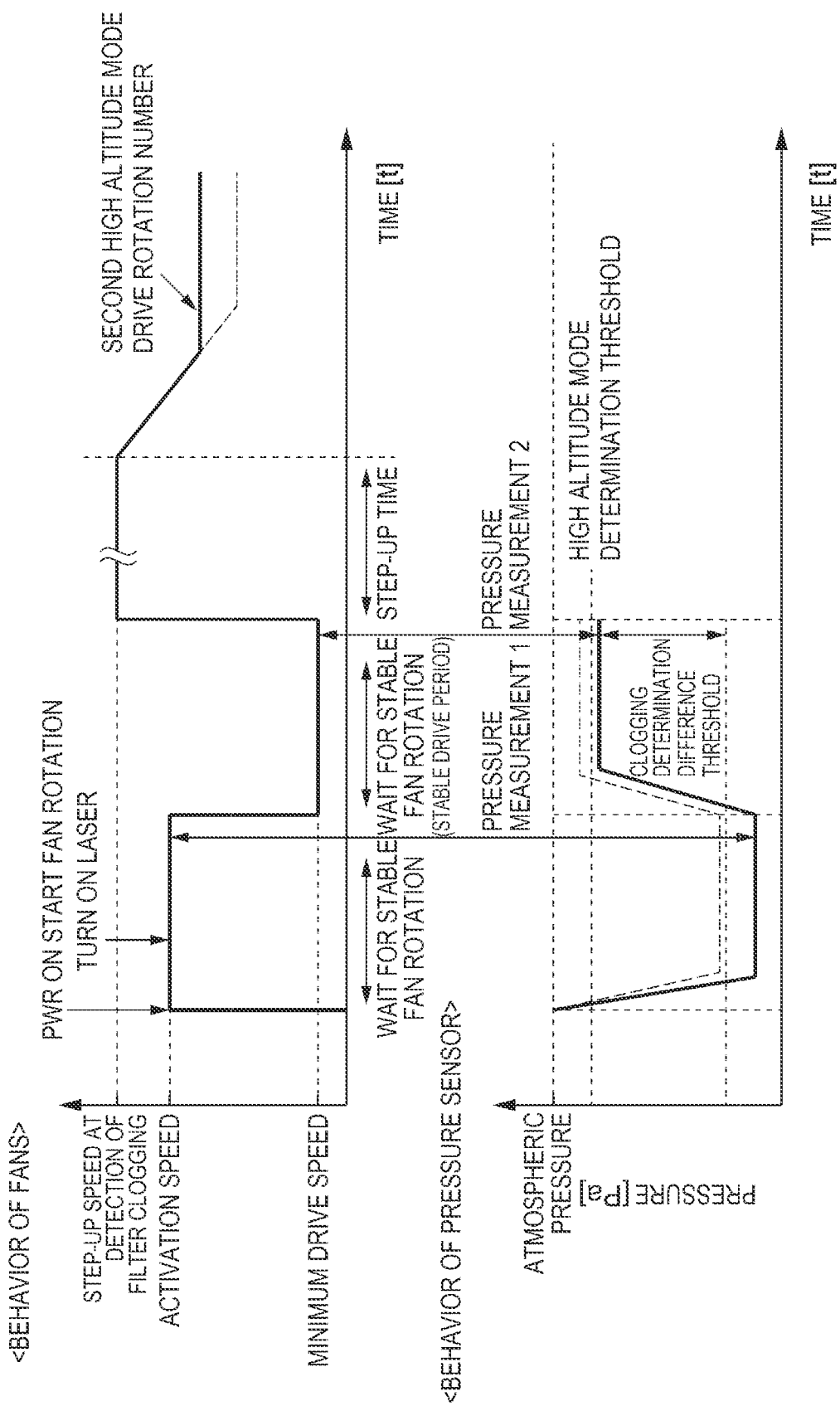
FIG. 15 (HIGH ALTITUDE: WITH CLOGGING)

PROJECTOR

The present application is based on, and claims priority from JP Application Serial Number 2021-197580, filed Dec. 6, 2021, the disclosure of which is hereby incorporated by reference herein in its entirety.

BACKGROUND

1. Technical Field

The present disclosure relates to a projector.

2. Related Art

JP-A-2009-188040 discloses a projector including a suction fan for taking the air from an intake opening into a housing, an exhaust fan for exhausting the air within the housing, a dustproof filter attached to the intake opening, and a pressure sensor detecting pressure within the housing, and detecting clogging of the dustproof filter based on output of the pressure sensor. The pressure sensor is placed between the suction fan and the exhaust fan.

However, in the projector disclosed in JP-A-2009-188040, it takes time before the pressure within the entire housing becomes constant, and there is a problem that, when the dustproof filter is clogged, it takes time before the interior of the housing is cooled. That is, it is desired that the cooling performance within the housing may be increased by early sensing of the clogging of the dustproof filter and the time after the power is turned on and before an image is projected may be shortened.

SUMMARY

A projector includes an exterior housing taking in outside air via a filter, a light source placed in the exterior housing, an image forming apparatus placed in the exterior housing and converting a light from the light source into an image light, a suction fan placed in the exterior housing and having an intake opening taking in the outside air, a front chamber placed in the exterior housing and communicating with the filter and the intake opening, a pressure sensor placed in the front chamber, and a control unit drive-controlling the suction fan, wherein the control unit executes first measurement processing of activating the suction fan and measuring pressure of the front chamber at a rotation number at the activation by the pressure sensor, second measurement processing of setting the rotation number of the suction fan to a rotation number lower than the rotation number at the activation and measuring the pressure of the front chamber by the pressure sensor, and determination processing of determining clogging of the filter based on a difference between a pressure value of the first measurement processing and a pressure value of the second measurement processing.

A projector includes an exterior housing taking in outside air via a filter, a light source placed in the exterior housing, an image forming apparatus placed in the exterior housing and converting a light from the light source into an image light, a suction fan placed in the exterior housing and having an intake opening taking in the outside air, a front chamber placed in the exterior housing and communicating with the filter and the intake opening, a pressure sensor placed in the front chamber, and a control unit drive-controlling the suction fan, wherein the control unit executes first measurement processing of driving the suction fan, setting pressure of the front chamber to negative pressure, and measuring the pressure by the pressure sensor, second measurement processing of driving the suction fan, setting the pressure of the front chamber to pseudo-outside air pressure, and measuring the pressure by the pressure sensor, and determination processing of determining clogging of the filter based on a difference between a pressure value of the first measurement processing and a pressure value of the second measurement processing.

BRIEF DESCRIPTION OF THE DRAWINGS

FIG. 14 is a timing chart showing a driving method of the suction fans.

FIG. 15 is a timing chart showing a driving method of the suction fans.

DESCRIPTION OF EXEMPLARY EMBODIMENTS

In the following respective drawings, three axes orthogonal to one another are referred to as "X-axis", "Y-axis", and "Z-axis" for explanation. Directions along the X-axis are "X directions", directions along the Y-axis are "Y directions", directions along the Z-axis are "Z directions", directions pointed by arrows are + directions, and opposite directions to the + directions are − directions. Note that the +Z direction may be referred to as "upside" or "upper", the −Z direction may be referred to as "downside" or "lower", and a view as seen from the +Z direction may be referred to as "plan view" or "planar". Further, a surface at the plus side in the Z direction is referred to as "upper surface" and a surface at the negative side in the Z direction is referred to as "lower surface" for explanation. In the embodiment, a direction from a front surface 100a to a back surface 100b of an exterior housing 100, which will be described later, is defined as the +Y direction of the Y-axis, a direction of an exhaust opening 210 of the X-axis orthogonal to the Y-axis is defined as the +X direction, and a direction in which a projection opening of the Z-axis orthogonal to the Y-axis and the X-axis is defined as the +Z direction.

First, a configuration of a projector 1000 will be explained with reference to FIGS. 1 to 3.

Figure 1:
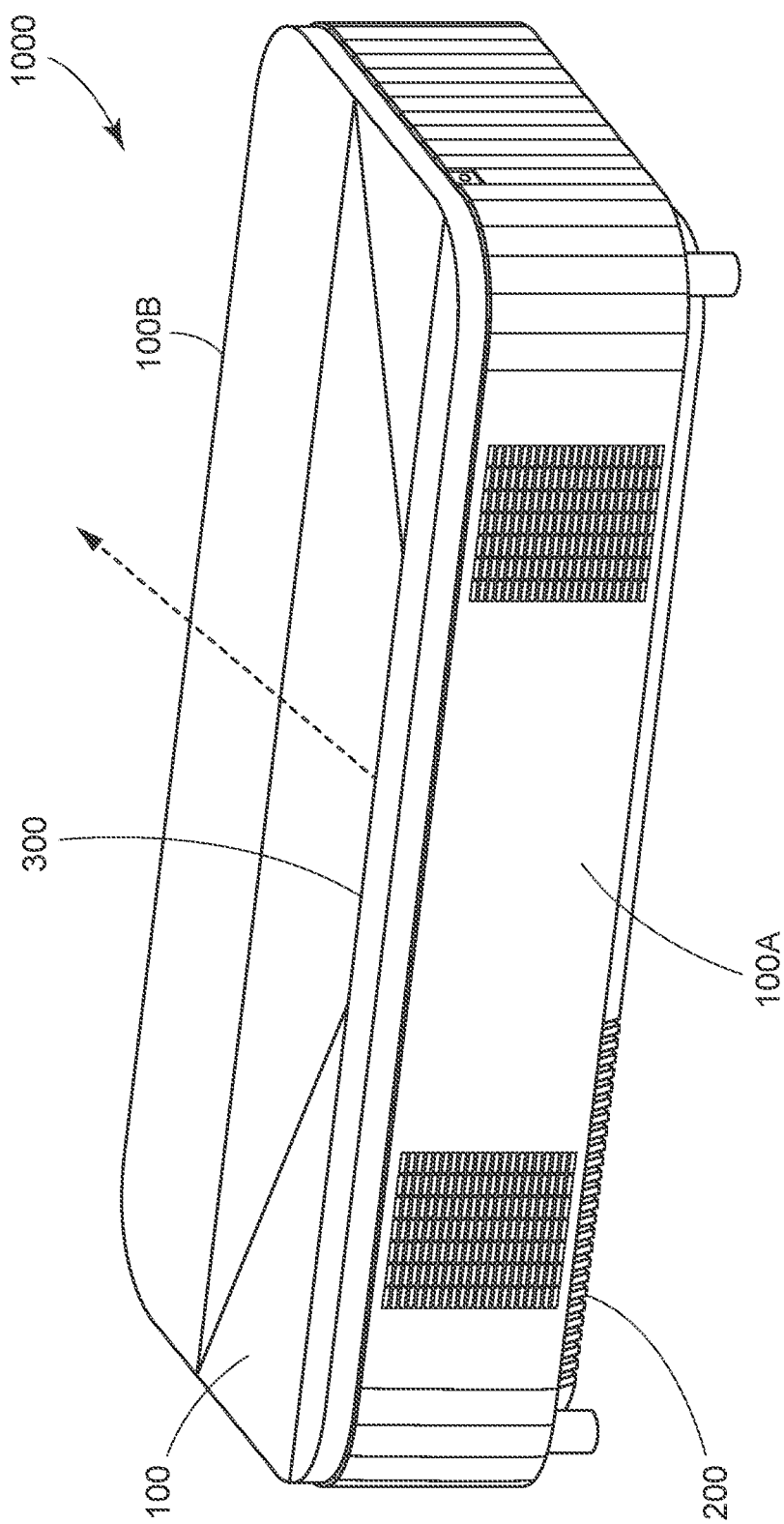
FIG. 1 is a perspective view showing a configuration of a projector.

As shown in FIG. 1, the projector 1000 includes the exterior housing 100, an intake opening 200 placed at a side of the front surface 100a of the exterior housing 100, and a projection optical unit 300 projecting an image light L to the back surface 100b side of the exterior housing 100. In the projection optical unit 300, a reflection mirror for reflecting the image light L is placed.

Figure 2:
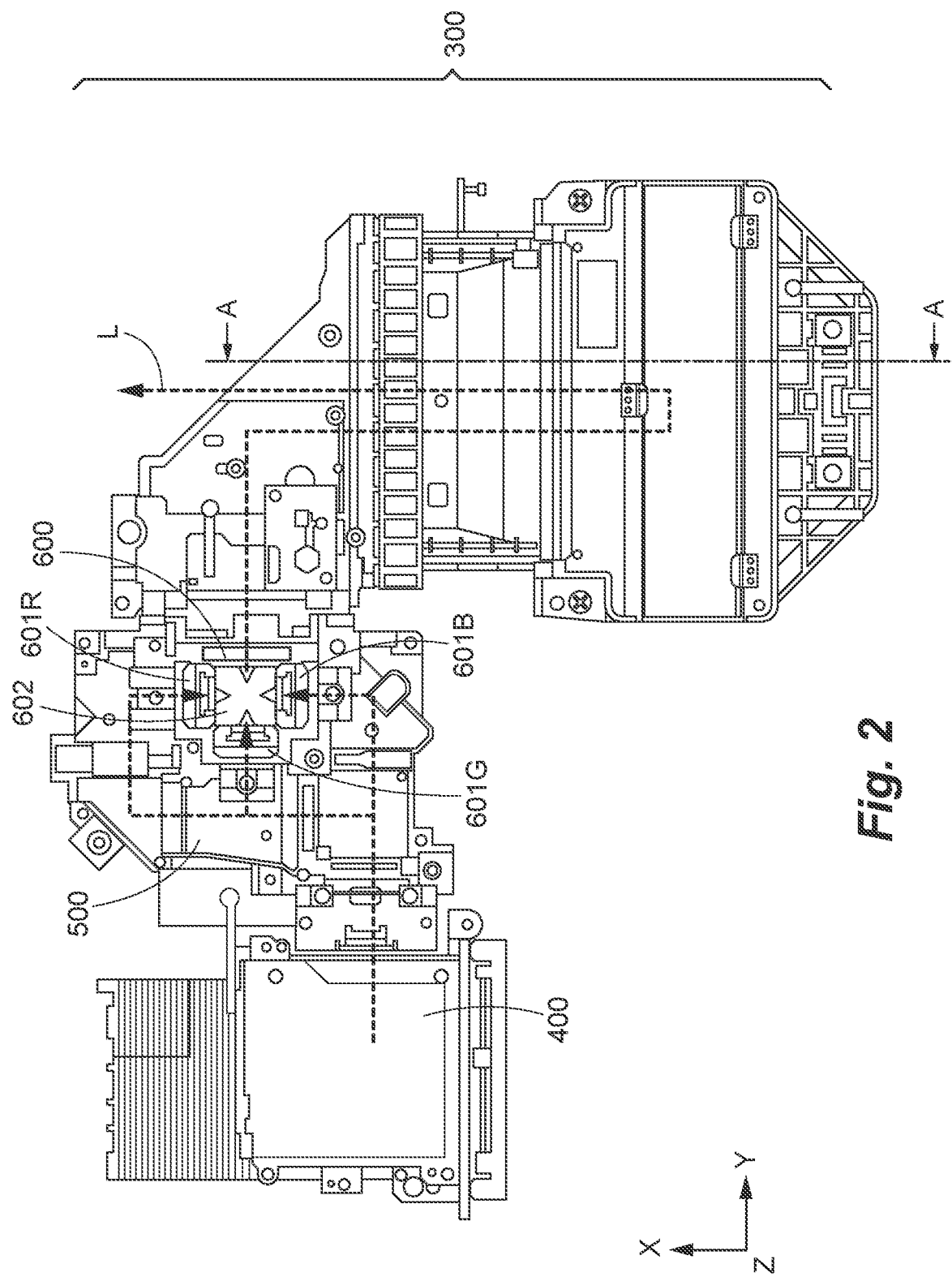
FIG. 2 is a plan view showing configurations from a light source unit to a projection optical unit.

As shown in FIG. 2, the projector 1000 includes a light source unit 400, a light guide optical unit 500, an image forming unit 600 as an image forming apparatus, and the projection optical unit 300. The light source unit 400, the light guide optical unit 500, the image forming unit 600, and the projection optical unit 300 are placed along a system optical axis and project the image light L.

The light source unit 400 includes e.g. a light source 401 having a solid-state light source of laser semiconductor providing higher intensity or a phosphor wavelength conversion element that wavelength-converts a part of a laser beam as an exciting light, an integrator lens, and a polarization conversion element. Note that the light source 401 may be an LED light source or a white light source such as a super-high pressure mercury lamp or a halogen lamp. The polarization conversion element has a function of aligning a P-polarized light component and an S-polarized light component output from the light source 401.

The light guide optical unit 500 includes e.g. a dichroic mirror as a light separating element, a reflection mirror, and a relay lens.

The image forming unit 600 is a part generating an image light from the light output from the light source unit 400, and includes liquid crystal panels 601R, 601G, 601B as three light modulation panels and a cross dichroic prism 602 as a light combining element.

Figure 3:
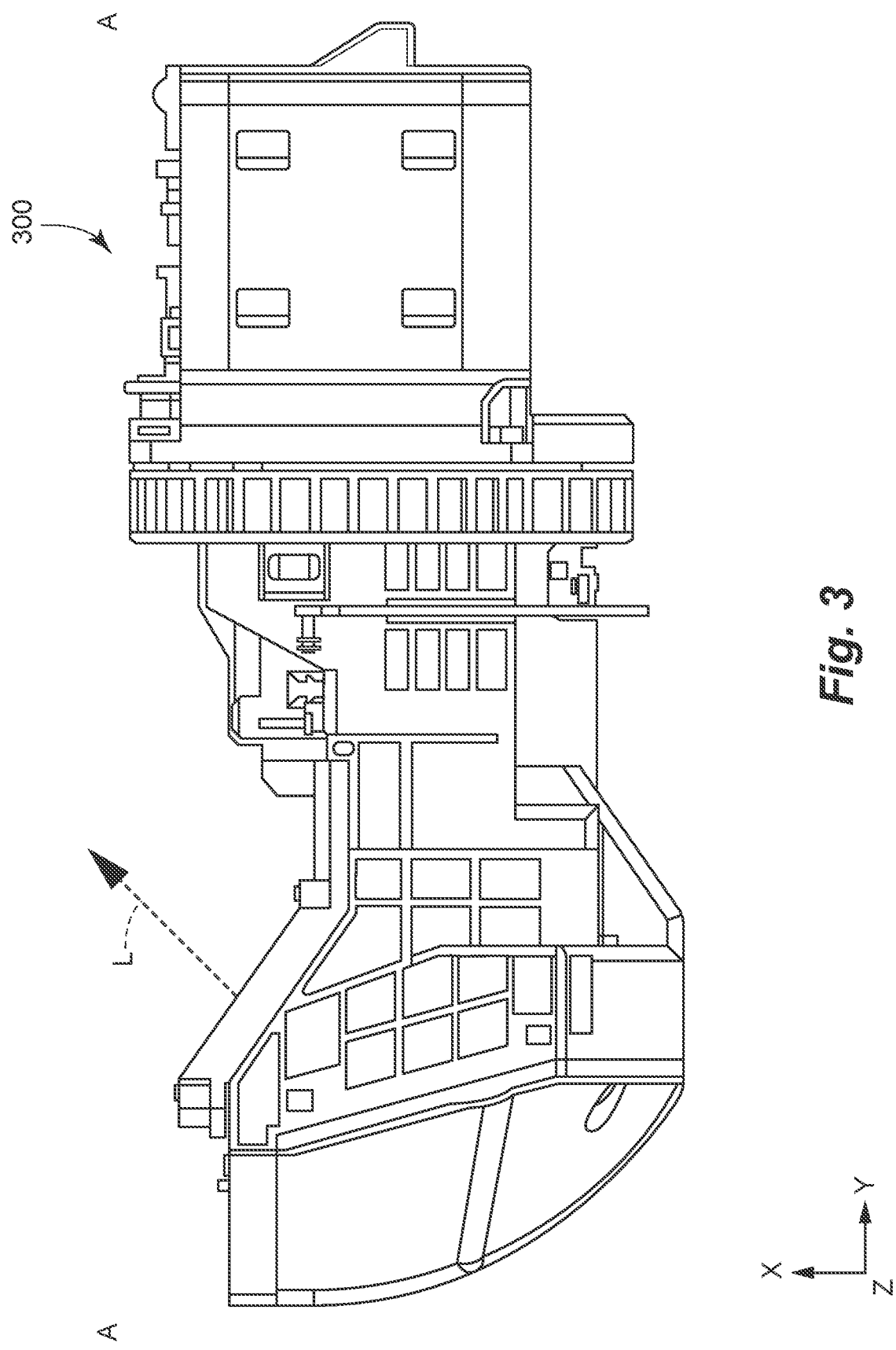
FIG. 3 is a sectional view along line A-A' shown in FIG. 2.

As shown in FIG. 3, the projection optical unit 300 is attached to the exterior housing 100. Note that a lens-shift mechanism may be provided in the projection optical unit 300. The combined image light L is projected on a screen by a projection lens and an image is enlarged and displayed thereon.

Next, a flow of outside air G taken into the projector 1000 will be explained with reference to FIGS. 4 to 8.

Figure 4:
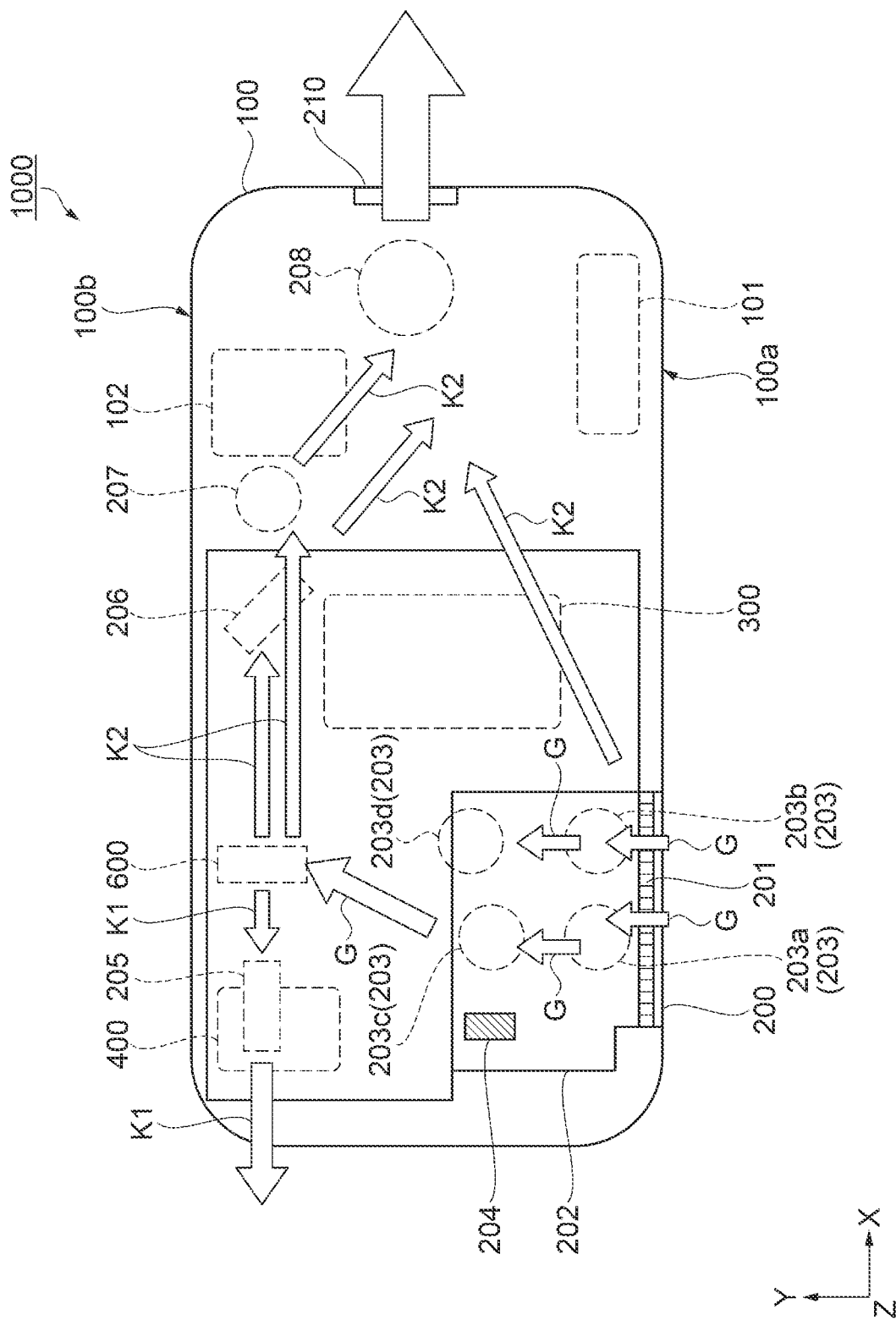
FIG. 4 is a plan view of an interior of the projector as seen from an upper surface side.

As shown in FIG. 4, as described above, the projector 1000 includes the light source unit 400, the image forming unit 600, and the projection optical unit 300 in the exterior housing 100. A speaker unit 101 is placed on the right side at the front surface 100a side of the exterior housing 100, i.e., the +X direction side with respect to the projection optical unit 300. A power supply unit 102 is placed on the right side at the back surface 100b side of the exterior housing 100, i.e., the +X direction side with respect to the projection optical unit 300 and the +Y direction side with respect to the speaker unit 101.

As described above, the intake opening 200 is placed in the exterior housing 100 at the left side of the front surface 100a of the exterior housing 100, i.e., the −X direction side with respect to the projection optical unit 300. A filter 201 catching dust contained in the outside air is placed in the intake opening 200. A front chamber 202 having a plurality of suction fans, in the embodiment, four suction fans 203a, 203b, 203c, 203d is placed at the inner side than the filter 201 of the exterior housing 100.

The front chamber 202 is a space partitioning between the filter 201 and intake openings 203x of the suction fans 203 and forms a pseudo-outside air pressure forming chamber. The intake opening 203x is a mouth portion of the suction fan 203. Further, the suction fan 203 has an ejection opening ejecting the taken outside air G. A pressure sensor 204 measuring the pressure of the interior of the front chamber 202 is placed in a part of the front chamber 202.

The three suction fans 203a, 203c, 203d blow the outside air to the three liquid crystal panels 601 forming the image forming unit 600. The other one suction fan 203b blows the outside air to the projection lens and the polarization conversion element forming the projection optical unit 300. The outside air is blown using ducts.

Figure 5:
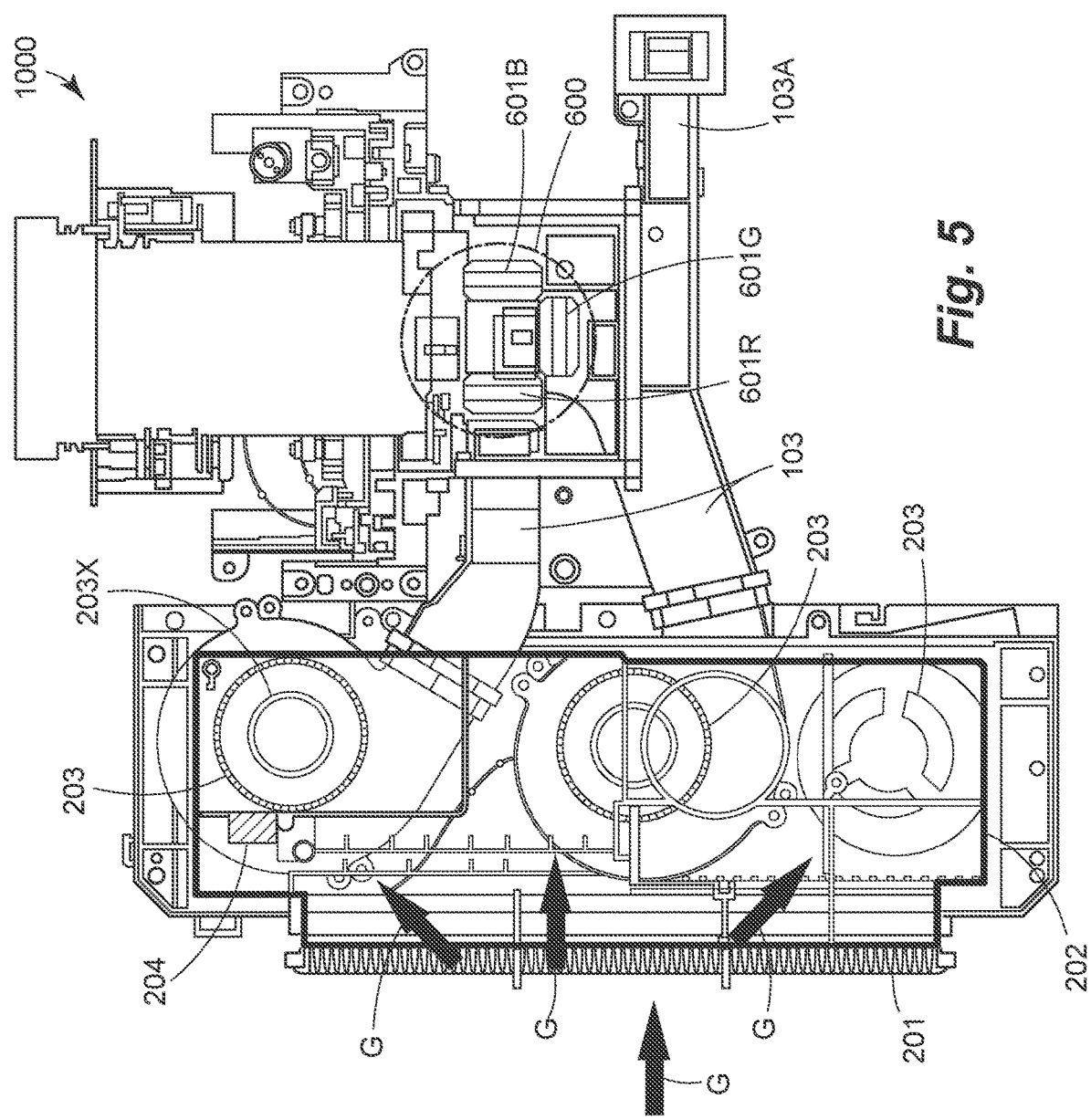
FIG. 5 is a plan view showing part of the configurations within the projector.

As shown in FIG. 5, the ejection openings (not shown) of the suction fans 203 are coupled to the red liquid crystal panel 601R, the green liquid crystal panel 601G, and the blue liquid crystal panel 601B forming the image forming unit 600 via ducts 103. Specifically, the three suction fans 203a, 203c, 203d shown in FIG. 4 blow the air to the respective liquid crystal panels 601 via the individual ducts 103.

Note that, unlike the above described configuration, objects to be cooled by the suction fans 203a, 203b, 203c, 203d are not necessarily determined. For example, a part of the suction fans 203 and one duct 103 may be coupled and the one duct 103 may be branched into three in the middle to blow the air to the respective liquid crystal panels 601. A part 103a of the duct 103 is configured to blow the air to the polarization conversion element.

The number of the suction fans 203 is not limited to four, but may be only one. In this case, for example, the air may be blown to only the liquid crystal panel 601 that is most necessary to be cooled as a heat source, e.g., the blue liquid crystal panel 601B. Further, the intake openings 203x of the plurality of suction fans 203 are open into one front chamber 202, however, the front chamber 202 and the pressure sensor 204 may be provided with respect to each suction fan 203.

As shown in FIG. 4, a part of air K1 blown from the suction fans 203 and cooling the image forming unit 600 is suctioned by a fan 205. The air K1 blown from the fan 205 cools the light source unit 400 and is exhausted to the outside from an exhaust opening (not shown) of the exterior housing 100 in the −X direction with respect to the light source unit 400 at the left side of the exterior housing 100. Further, air K2 cooling the image forming unit 600, the power supply unit 102, the projection optical unit 300, etc. is exhausted from the exhaust opening 210 of the exterior housing 100 in the +X direction at the right side of the exterior housing 100 via fans 206, 207, 208.

As shown in FIG. 5, the pressure sensor 204 is placed in a space between the filter 201 and the intake openings 203x of the suction fans 203.

Next, a flow of the air K in a plan view and a sectional view will be explained with reference to FIGS. 6 to 8.

Figure 6:
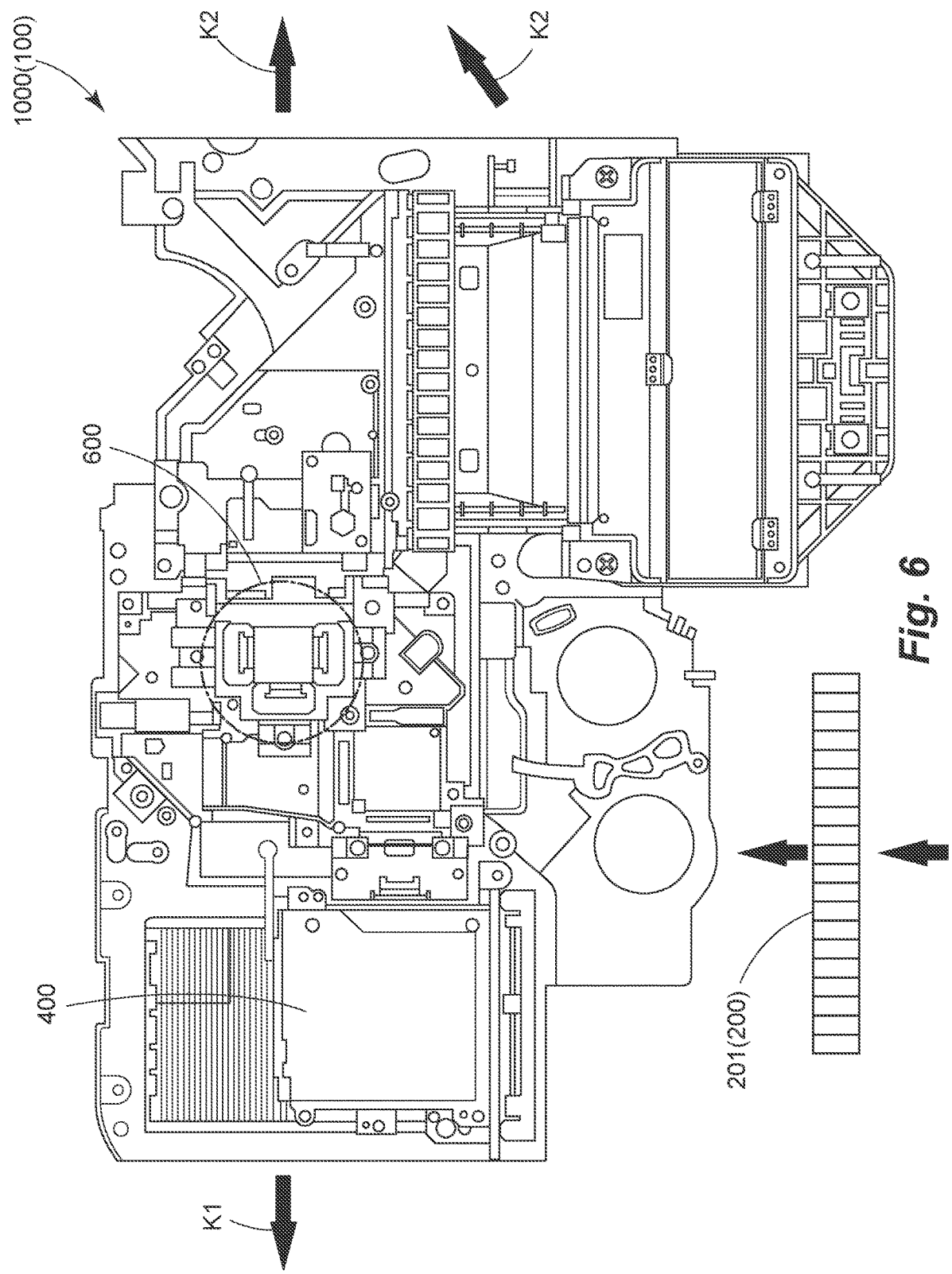
FIG. 6 is a plan view showing configurations from the light source unit to the projection optical unit.

As shown in FIG. 6, in the plan view, the outside air G is taken into the exterior housing 100 via the filter 201 placed in the intake opening 200 of the projector 1000.

Figure 7:
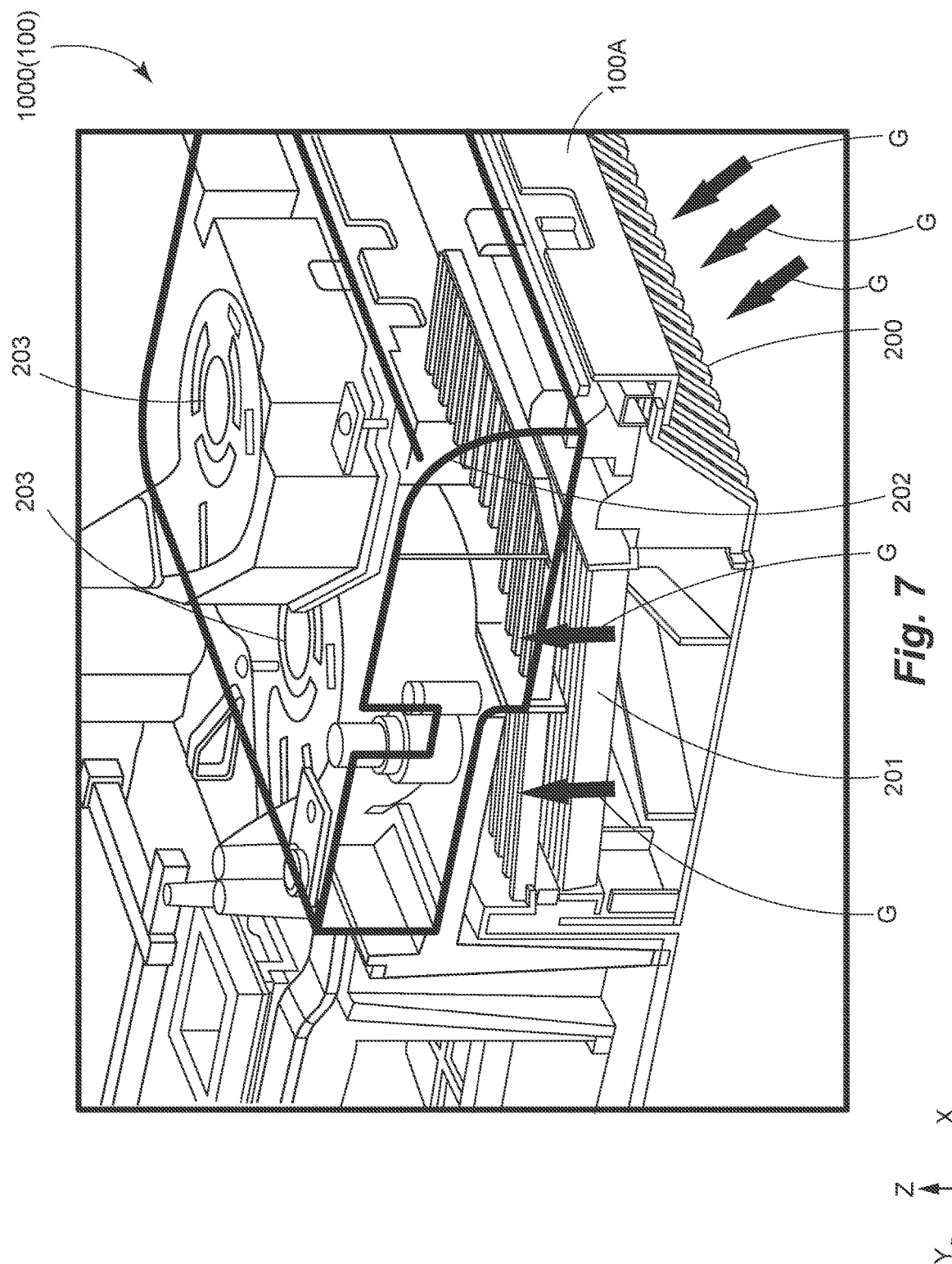
FIG. 7 is a perspective view showing a part of the configuration of the projector.
Figure 8:
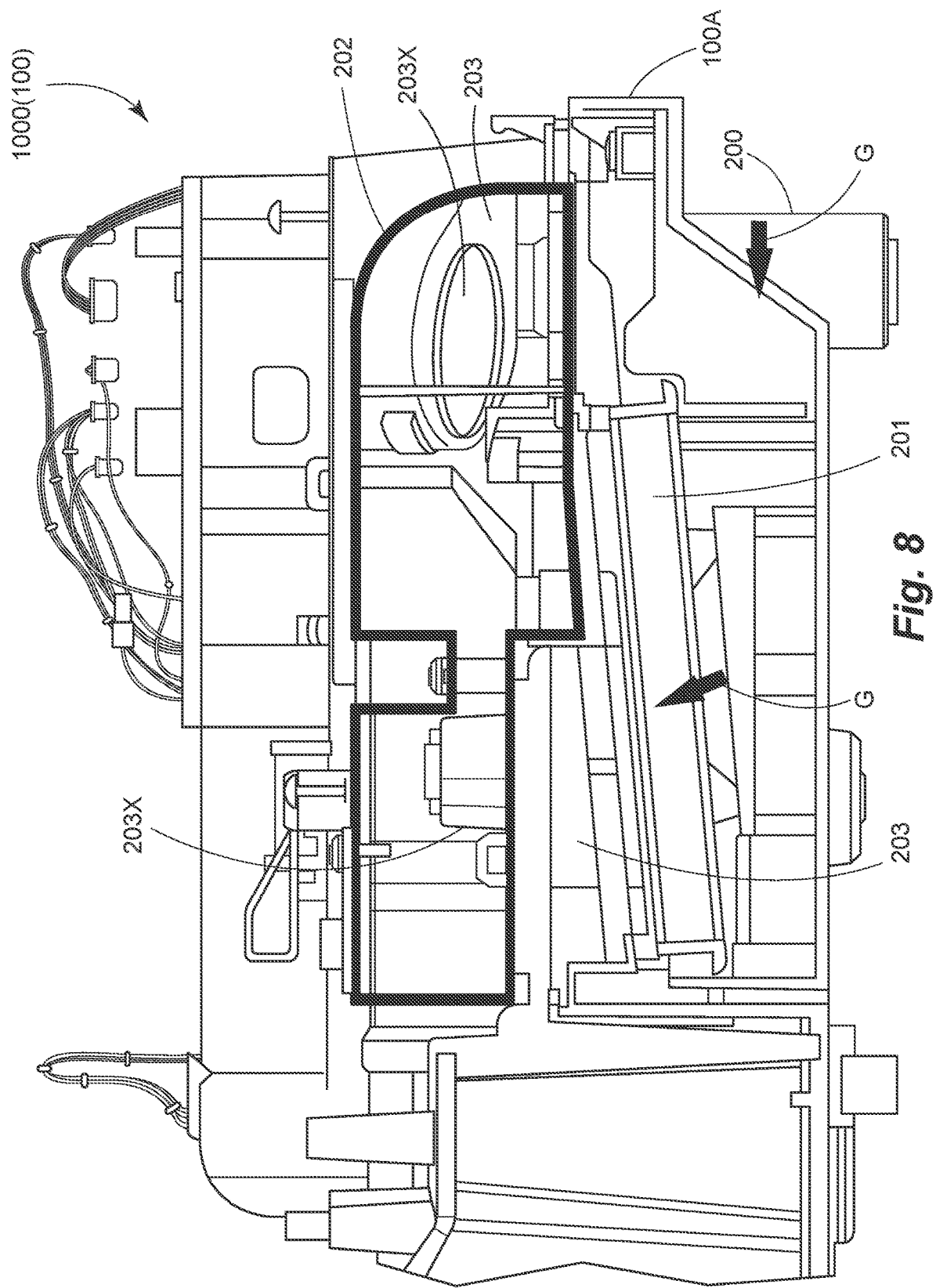
FIG. 8 is a side view of the interior of the projector as seen from a side surface side.

As shown in FIG. 7, when the projector 1000 is seen obliquely, the outside air G is taken into the exterior housing 100 from the intake opening 200 placed at the lower left of the front surface 100a of the exterior housing 100. The taken outside air G passes through the filter 201 and enters the front chamber 202.

The filter 201 is placed to face the lower part of the suction fans 203, i.e., the −Z direction. As shown in FIG. 8, when the projector 1000 is seen from a side, the outside air G is taken into the exterior housing 100 from the intake opening 200 placed at the downside of the front surface 100a of the exterior housing 100. The taken outside air G passes through the filter 201 and enters the front chamber 202. Note that the suction fans 203 may be placed in the front chamber 202 or outside of the front chamber 202 as long as the intake openings 203x may be placed to communicate with the front chamber 202. Or, the intake openings 203x may be in a side surface of the wall or inside of the front chamber 202.

Figure 9:
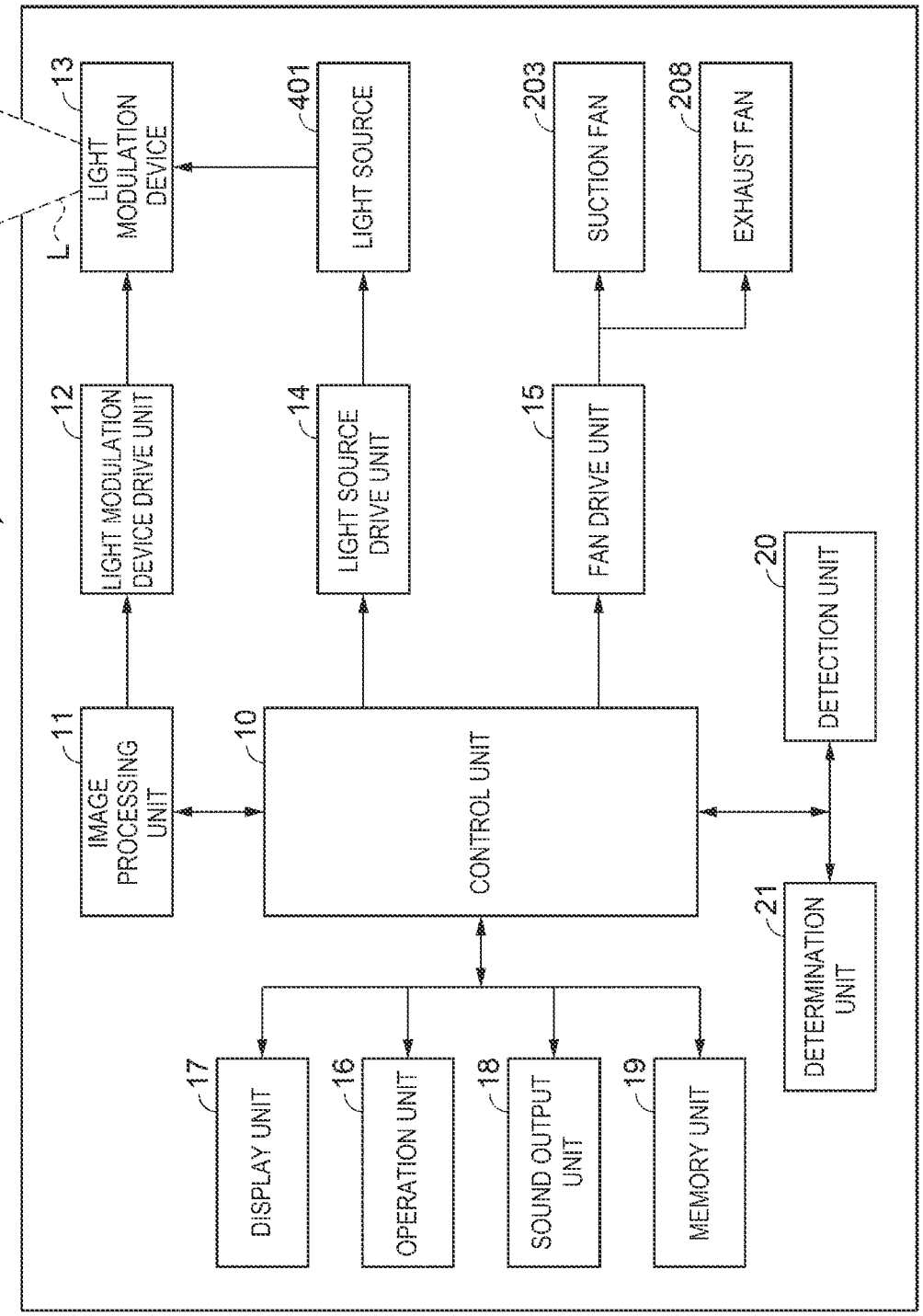
FIG. 9 is a block diagram showing the configuration of the projector.

Next, the configuration of the projector 1000 will be explained with reference to FIG. 9.

The projector 1000 includes a control unit 10 controlling the entire operation of the projector 1000, an image processing unit 11, a light modulation device drive unit 12, a light modulation device 13, the light source 401, and a light source drive unit 14 driving the light source 401.

Further, the projector 1000 includes the suction fans 203 taking in the air from outside via the above described intake opening 200, the exhaust fan 208 exhausting the air within the exterior housing 100 to the outside via the exhaust opening 210 (see FIG. 4) formed in the exterior housing 100, and a fan drive unit 15 respectively driving the suction fans 203 and the exhaust fan 208.

Furthermore, the projector 1000 includes an operation unit 16 containing switches for inputting various operation signals to the control unit 10, a display unit 17 showing a status of the projector 1000, a sound output unit 18, and a nonvolatile memory unit 19 holding various kinds of data and programs.

Moreover, the projector 1000 includes a detection unit 20 detecting the output of the pressure sensor 204 and a determination unit 21 determining whether or not the filter 201 is clogged based on a pressure value of the front chamber 202 detected by the detection unit 20 and a threshold.

The control unit 10 includes a microcomputer containing a CPU and memories such as a ROM and a RAM, and controls the entire operation of the projector 1000, e.g. the respective operations of the image processing unit 11, the light source drive unit 14, the fan drive unit 15, the display unit 17, the operation unit 16, the sound output unit 18, the memory unit 19, the detection unit 20, and the determination unit 21 according to various programs stored in the ROM.

The light modulation device 13 includes a liquid crystal light valve containing the three liquid crystal panels 601R, 601G, 601B modulating the light output from the light source 401, and modulates the respective color lights of a red light R, a green light G, and a blue light B.

The light output from the light source 401 is separated into the respective color lights by the light guide optical unit 500, then, modulated by the liquid crystal light valve (not shown) containing the corresponding liquid crystal panels 601, combined by the cross dichroic prism 602, and then, enlarged d projected by the projection optical unit 300.

For example, the image processing unit 11 supplies a generated frame picture signal to the light modulation device drive unit 12. When the operation unit 16 is operated, the control unit 10 drives the light source drive unit 14 to turn on the light source 401 and drives the fan drive unit 15 to rotate the suction fans 203 and the exhaust fan 208.

Thereby, the outside air is taken into the exterior housing 100 and the air within the exterior housing 100 is exhausted to cool the interior of the exterior housing 100. Further, the control unit 10 activates the image processing unit 11, the image processing unit 11 performs various kinds of processing on the input picture signal and generates and supplies the frame picture signal to the light modulation device drive unit 12, and thereby, light transmittance of the respective pixels of the light modulation device 13 is controlled based on the frame picture signal.

Next, a driving method for the suction fans 203 will be explained with reference to FIGS. 10 to 13. As below, a driving method when the projector 1000 is used at a low altitude will be explained.

Figure 10:
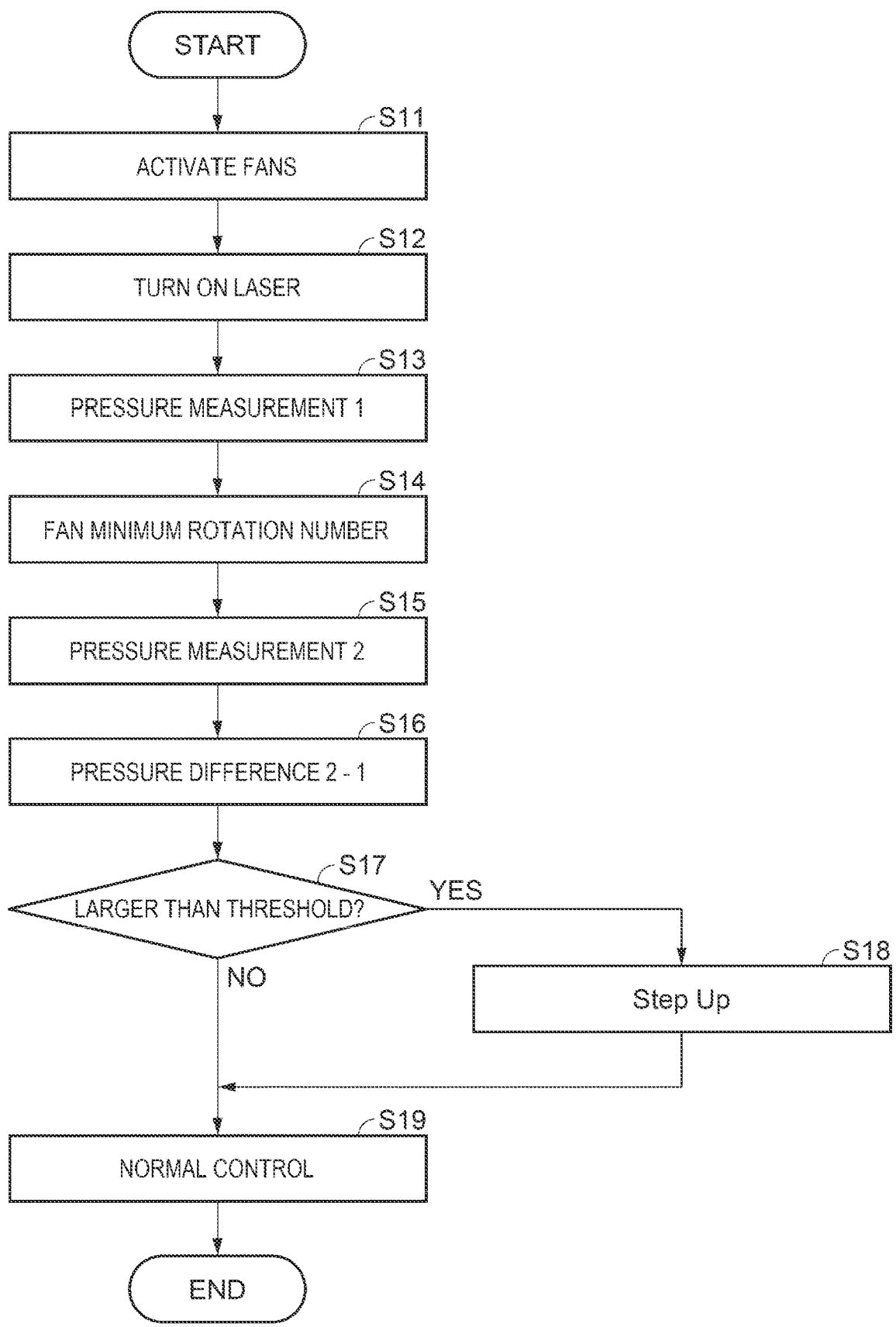
FIG. 10 is a flowchart showing a driving method of suction fans.
Figure 11:
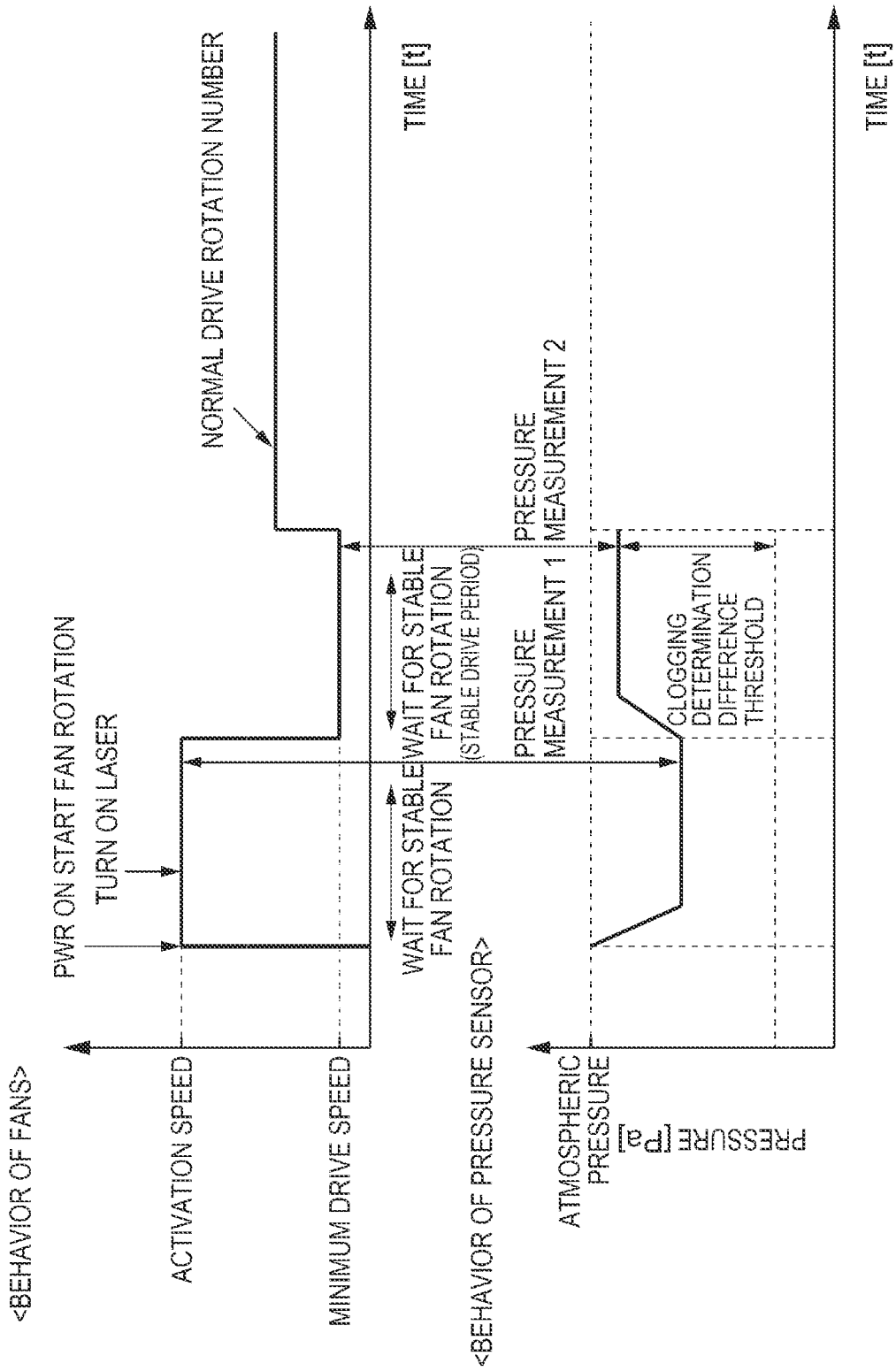
FIG. 11 is a timing chart showing a driving method of the suction fans.

As shown in FIG. 10, at step S11, a user turns on the power of the projector 1000, and then, the control unit 10 controls the fan drive unit 15 to activate and drive the suction fans 203. Specifically, as shown in FIG. 11, the suction fans 203 are activated at an activation speed. At the activation speed, the suction fans 203 are driven at a higher rotation number than that in normal driving for stable driving.

Note that, in a timing chart of the behavior of the suction fans 203 shown in FIG. 11, the horizontal axis shows a lapse of time and the vertical axis shows the rotation number of the suction fans 203. The rotation number is higher upward along the vertical axis. Further, in a timing chart of the behavior of the pressure sensor 204, the horizontal axis shows a lapse of time and the vertical axis shows the pressure. The pressure is lower downward along the vertical axis.

Note that the rotation number is a rotation number necessary for stable driving of the suction fans 203 when the suction fans 203 are activated. The rotation number is set to a rotation number lower than that for the maximum driving of the suction fans 203 for suppressing noise. If the noise is not considered, the suction fans 203 may be driven at the maximum. In a period at the activation in which the rotation number of the suction fans 203 is increased and the drive force is increased, the outside air G is taken into the front chamber 202 via the filter 201. In FIG. 11, "PWR ON START FAN ROTATION" is shown. Note that the behavior of the pressure sensor 204 is at the atmospheric pressure.

At step S12, the control unit 10 controls the light source drive unit 14 to turn on a laser as the light source 401. Here, the laser is used as the light source 401. Specifically, as shown in FIG. 11, the suction fans 203 keep the activation speed. The behavior of the pressure sensor 204 of the front chamber 202 takes a pressure value lower than the atmospheric pressure. When the light source 401 is activated, by the light from the light source 401, the temperature rises with the liquid crystal panel 601, the polarization conversion element, the phosphor, etc. as heat sources. The phosphor has a function of fluorescence conversion of excitation light.

At step S13, the control unit 10 controls the detection unit 20 to measure a pressure measurement 1, a first measurement as first measurement processing. Specifically, the suction fans 203 keep the status of the activation speed. The pressure of the front chamber 202 at the time is measured using the pressure sensor 204 and a reference value is obtained.

At step S14, the control unit 10 controls the fan drive unit 15 to set the rotation number of the suction fans 203 to the minimum rotation number. Specifically, as shown in FIG. 11, after the pressure measurement 1, the suction fans 203 are set to the minimum drive speed. At the minimum drive speed, the front chamber 202 is set to pressure at the same degree as the outside air pressure, i.e., the atmospheric pressure. If the suction fans 203 are stopped, activation driving is necessary again for activation, and the suction fans are driven as at a low speed as possible. The pressure of the front chamber 202 at the time is pseudo-outside air pressure equal to the atmospheric pressure. A period for the rotation at the minimum rotation number is referred to as "stable drive period".

At step S15, the control unit 10 controls the detection unit 20 to measure a pressure measurement 2, a second measurement as second measurement processing. As described above, the pressure of the front chamber 202 is the pseudo-outside air pressure, i.e., pseudo-atmospheric pressure. As a threshold of clogging of the filter 201, a threshold is set with reference to a pressure value acquired in the pressure measurement 2.

At step S16, the control unit 10 controls an arithmetic processing unit (not shown) to obtain a difference between the pressure value measured in the pressure measurement 2 and the pressure value measured in the pressure measurement 1 (pressure difference=pressure measurement 2−pressure measurement 1).

At step S17, the control unit 10 controls the determination unit 21 to determine whether or not the pressure difference obtained at step S16 is larger than the threshold as determination processing. When the pressure difference is smaller than the threshold and the filter 201 is not clogged, the process goes to step S19. When the pressure difference is larger than the threshold and the filter 201 is clogged, the process goes to step S18.

As shown in FIG. 11, when the filter 201 is not clogged and the process goes to step S19, the control unit 10 controls the fan drive unit 15 to increase the rotation number of the suction fans 203 from the minimum drive speed and drive the suction fans at a normal drive rotation number. The rotation number is a rotation number necessary for maintaining the cooling function for the liquid crystal panel 601, the polarization conversion element, and the light source 401 as the heat sources. The rotation number of the normal control is lower than the rotation number at the activation speed. The behavior of the pressure sensor 204 shows a pressure value with the addition of negative pressure to the atmospheric pressure.

Figure 12:
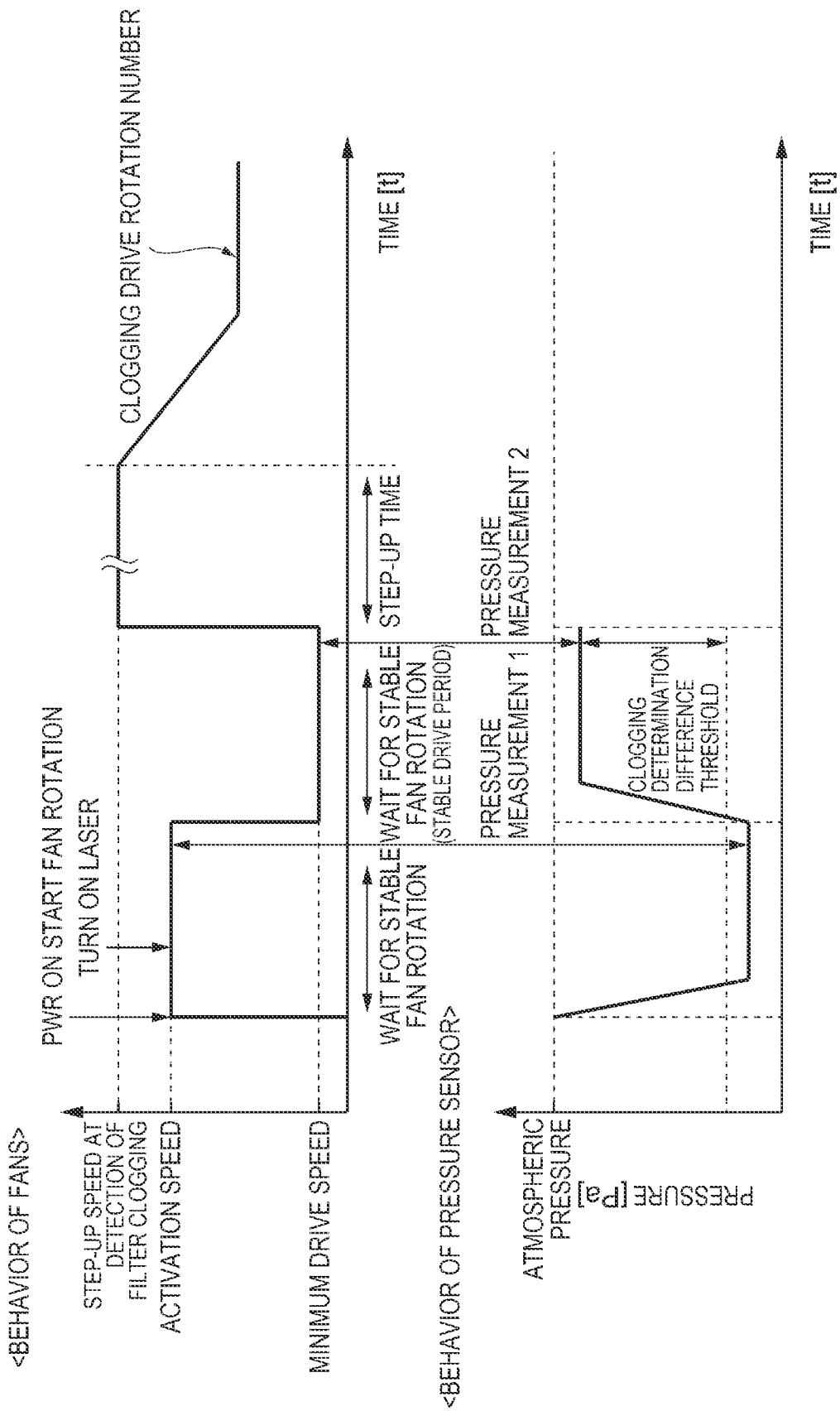
FIG. 12 is a timing chart showing a driving method of the suction fans.

As shown in FIG. 12, when the filter 201 is clogged and the process goes to step S18, the control unit 10 controls the fan drive unit 15 to drive the suction fans 203 at a higher rotation number than the rotation number of the activation speed in a fixed time as a step-up time. In FIG. 12, "STEP-UP SPEED" is shown. The light source 401 is driven after the activation of the suction fans 203 and, for example, the temperatures of the liquid crystal panels 601 continue to rise. Accordingly, the temperature rises of the liquid crystal panels 601 are stopped by driving of the suction fans 203 for temperature control.

During the step-up time, the rotation number is increased to a rotation number higher than the rotation number of the activation speed in preference to noise prevention of the suction fans 203. Full rotation driving may be employed. At the time, the pressure value of the pressure sensor 204 placed in the front chamber 202 becomes even lower to negative pressure. As described above, when the clogging occurs, the higher rotation number is set, and thereby, the temperature rises of the heat sources may be suppressed earlier.

Note that, when the filter 201 is clogged, as shown in FIG. 12, the pressure value in the pressure measurement 1 is lower than that when not clogged. That is, the negative pressure is larger. Thereby, the pressure difference obtained at step S16 is determined as being larger than the threshold at step S17.

The pressure measurements of the front chamber 202 are performed using the activation drive operation of the suction fans 203 requiring the higher rotation number than the normal drive rotation number, and thereby, the amount of suctioned outside air is larger and the clogging may be significantly measured. Further, even when the clogging occurs, the suction fans 203 are driven at a lower speed and the pressure of the front chamber 202 in the pressure measurement 2 is not different from the pressure without the clogging and measured as pseudo-outside air pressure.

Further, as shown in FIG. 12, when the step-up time elapses, the rotation number of the suction fans 203 is reduced from the step-up speed to the drive rotation number of the suction fans 203 with the clogging, i.e., a clogging drive rotation number. In other words, the suction fans 203 are driven at the step-up speed as the rotation number higher than the clogging drive rotation number, and the rotation number is reduced to the clogging drive rotation number. The rotation number of the suction fans 203 at the time is set to a rotation number higher than the rotation number of the normal control without the clogging because of the environment in which the temperatures of the heat sources are likely to rise. Note that it is preferable to prepare a plurality of types of rotation driving according to the degree of clogging as the rotation driving with the clogging, not limited to the single rotation number.

Though not shown in FIG. 10, it is preferable that, when clogging of the filter 201 is determined, whether the use of the projector 1000 is continued or stopped is determined. The stoppage disables the maintenance of the cooling function for the liquid crystal panels 601, the polarization conversion element, and the light source 401 as the heat sources and is determined based on a threshold. That is, FIG. 12 shows a case at a level at which the cooling function for the heat sources may be maintained by the control of the suction fans 203. In the case of the stoppage, for example, the power of the projector 1000 is turned off or a warning is issued.

Figure 13:
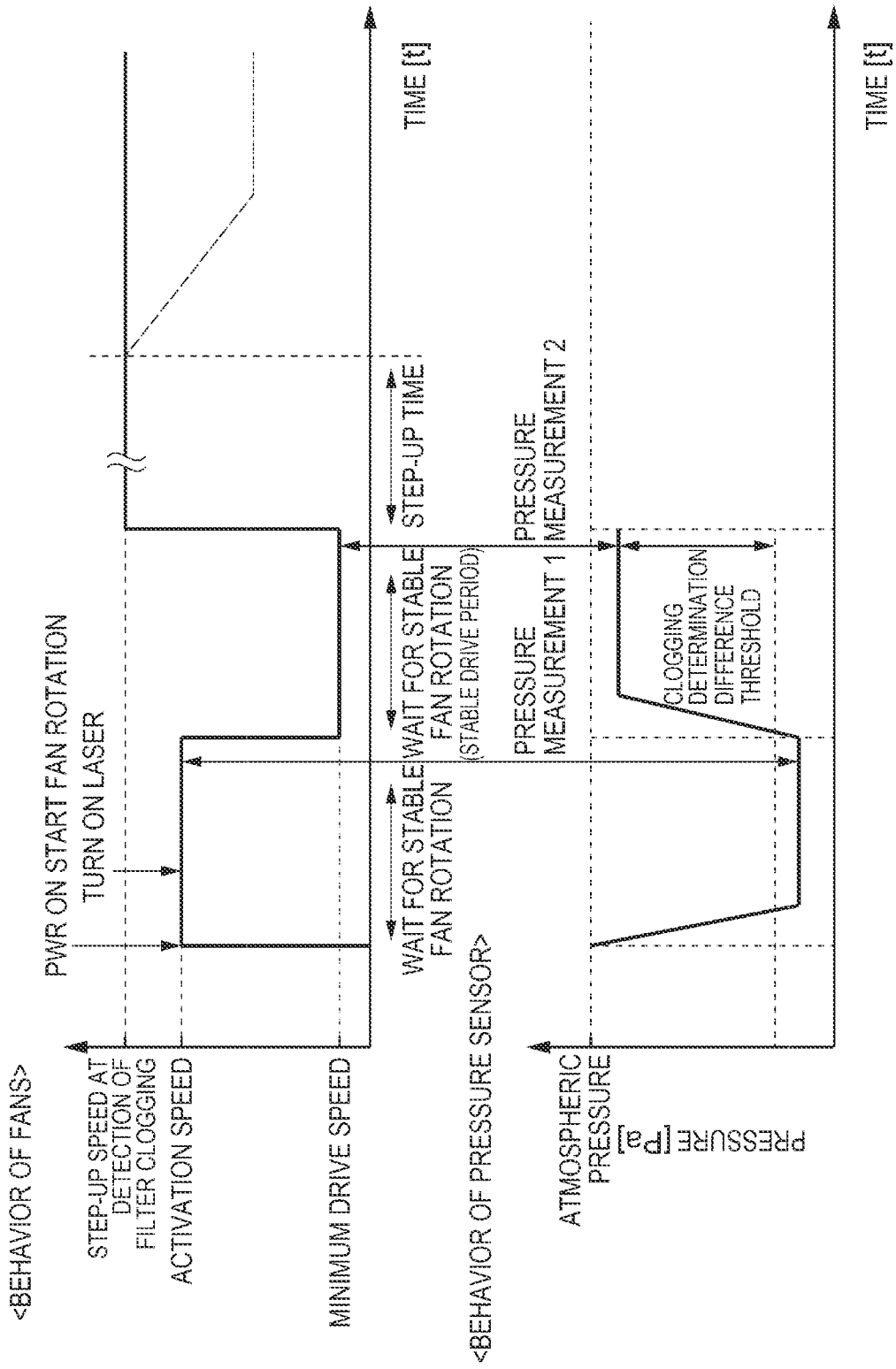
FIG. 13 is a timing chart showing a driving method of the suction fans.

Or, when the projector 1000 is usable, but clogging is heavier, as shown in FIG. 13, the suction fans 203 may be driven to maintain the rotation number of the step-up speed without change after the step-up time elapses.

The pressure measurement 1 uses the activation drive operation of the suction fans 203 requiring the higher rotation number than the normal drive rotation number and the pressure measurement 2 does not stop driving of the suction fans 203, and therefore, a time to projection of a projection image is not delayed by a clogging determination processing measurement.

Next, a driving method of the suction fans 203 when the projector 1000 is used at a high altitude will be explained with reference to FIGS. 14 and 15. Note that the parts different from the case where the projector 1000 is used at the low altitude will be specifically explained. The high altitude refers to e.g. an environment over 2000 m.

At the high altitude, the air pressure is lower and it is desirable to set the driving method for the cooling processing on the heat sources according to the high altitude. FIG. 14 shows a driving method without clogging at the high altitude. FIG. 15 shows a driving method with clogging at the high altitude.

As shown in FIG. 14, when the projector 1000 is activated and the suction fans 203 are activated, the value of the pressure sensor 204 is more negative pressure than that at the low altitude. Note that broken lines in the behavior of the pressure sensor 204 in FIG. 14 show pressure values without clogging at the low altitude for reference.

Therefore, in the pressure measurement 1, the first measurement as the first measurement processing, the pressure value is more negative pressure than that at the low altitude. Further, in the pressure measurement 2, the second measurement as the second measurement processing, similarly, the pressure value is more negative pressure than that at the low altitude.

Note that a high altitude mode determination threshold for comparison to the pseudo-outside air pressure of the pressure measurement 2, i.e., the pressure value of the pseudo-atmospheric pressure is set in advance. In other words, when the pressure value of the pressure measurement 2 is more negative pressure than the high altitude mode determination threshold, the driving method of the suction fans 203 at the high altitude is performed. The absolute values of the atmospheric pressure are largely different between the high altitude and the low altitude, and whether the high altitude or the low altitude may be determined only by the pressure value of the pressure measurement 2.

Whether or not clogging occurs is determined by comparison between a difference value between the pressure measurement 1 and the pressure measurement 2, and the threshold like the case of the low altitude. The case shown in FIG. 14 is a case where the difference value is smaller than the threshold and clogging does not occur.

When no clogging and the high altitude are determined, the suction fans 203 are driven at a first high altitude mode drive rotation number higher than the normal drive rotation number at the low altitude. At the high altitude, the temperatures of the heat sources are likely to rise and more cooling is necessary. As described above, the determination of the high altitude and the clogging determination may be accurately made using the pressure sensor 204.

Next, a driving method of the suction fans 203 with clogging will be explained with reference to FIG. 15.

As shown in FIG. 15, when clogging occurs at the high altitude, the pressure value of the pressure measurement 1 is a lower value than that at the low altitude. A threshold for determination as to whether or not clogging occurs is set based on the value of the pseudo-outside air pressure of the pressure measurement 2, i.e., the pseudo-atmospheric pressure and, when the difference value between the pressure measurement 1 and the pressure measurement 2 is larger than the threshold, clogging is determined.

When clogging is determined and the useability of the projector 1000 is determined, at the step-up time, the suction fans 203 are driven at the step-up speed, and then, driven at a second high altitude mode drive rotation number due to clogging. The second high altitude mode drive rotation number is higher than the clogging drive rotation number in the low-altitude mode.

As described above, the projector 1000 of the embodiment includes the exterior housing 100 taking in the outside air G via the filter 201, the light source 401 placed in the exterior housing 100, the image forming unit 600 placed in the exterior housing 100 and converting the light from the light source 401 into the image light, the suction fan 203 placed in the exterior housing 100 and having the intake openings 203x taking in the outside air G, the front chamber 202 placed in the exterior housing 100 and communicating with the filter 201 and the intake opening 203x, the pressure sensor 204 placed in the front chamber 202, and the control unit 10 drive-controlling the suction fan 203. The control unit 10 activates the suction fan 203 and executes the first measurement processing of measuring the pressure of the front chamber 202 at the rotation number at the activation by the pressure sensor 204, the second measurement processing of setting the rotation number of the suction fan 203 to a rotation number lower than the rotation number at the activation and measuring the pressure of the front chamber 202 by the pressure sensor 204, and the determination processing of determining clogging of the filter 201 based on the difference between the pressure value of the first measurement processing and the pressure value of the second measurement processing.

According to the configuration, the pressure value on which the t clogging condition of the filter 201 is reflected may be measured by the first measurement processing, the pressure value close to the pressure of the outside air G may be measured by the second measurement processing, and the clogging of the filter 201 may be determined based on the difference between the two pressure values by the determination processing. Further, the pressure sensor 204 is placed in the front chamber 202 and the pressure value of the front chamber 202 as a restricted region is measured, and thereby, compared to a case where the pressure value of the entire exterior housing 100 is measured, the time before the pressure becomes constant is shorter and the pressure value may be measured earlier. Thereby, clogging determination can be accurately performed in a short time after the activation of the suction fan 203 and, for example, the cooling processing based on the determination may be performed. Further, the cooling processing can be performed earlier and the image light may be projected in a short time after the activation of the suction fan 203.

In the projector 1000 of the embodiment, it is preferable that, when determining that clogging does not occur in the determination processing, the control unit 10 sets the normal driving of the suction fan 203 and drives the suction fan 203 at the normal drive rotation number higher than the rotation number in the second measurement processing and, when determining that clogging occurs in the determination processing, sets the clogging driving of the suction fan 203 and drives the suction fan 203 at the clogging drive rotation number higher than the normal drive rotation number. According to the configuration, when clogging is determined, the suction fan 203 is driven at the clogging drive rotation number higher than the normal drive rotation number, and thereby, the cooling performance can be maintained and the projector 1000 may be used.

In the projector 1000 of the embodiment, it is preferable that, when clogging is determined in the determination processing, the control unit 10 drives the suction fan 203 at the rotation number higher than the clogging drive rotation number, and then, the rotation number is reduced to the clogging drive rotation number. According to the configuration, when clogging is determined, the rotation number is set to the rotation number higher than the clogging drive rotation number, and thereby, temperature rises of the heat sources may be suppressed earlier.

In the projector 1000 of the embodiment, it is preferable that the control unit 10 turns on the light from the light source 401 after the activation of the suction fan 203 and before the first measurement processing and executes the second measurement processing in the stable drive period of the light source 401. According to the configuration, the light source 401 is turned on after the activation of the suction fan 203 and the second measurement processing is executed in the stable drive period, and thereby, the first measurement processing and the second measurement processing can be performed earlier and the projector 1000 may be made usable earlier.

In the projector 1000 of the embodiment, it is preferable that the control unit 10 has the threshold for determination of the high altitude and the low altitude and, when the pressure value of the second measurement processing is compared to the threshold and the high altitude is determined, the suction fan 203 is driven at the rotation number higher than the rotation number at the low altitude. According to the configuration, the pressure value of the second measurement processing as the pseudo-atmospheric pressure is compared to the threshold and, when the high altitude is determined, the suction fan 203 is driven at the higher rotation number, and thereby, the cooling performance can be maintained and the projector 1000 may be used.

In the projector 1000 of the embodiment, it is preferable that the image forming unit 600 has the liquid crystal panel 601, the suction fan 203 has the ejection opening, the ejection opening and the liquid crystal panel 601 are coupled by the duct 103. According to the configuration, the duct 103 is provided, and thereby, the liquid crystal panel 601 may be cooled according to the clogging of the filter 201.

In the projector 1000 of the embodiment, it is preferable that another suction fan 203 different from the suction fan 203 is provided, the other suction fan 203 has another intake opening 203x, and the other intake opening 203x communicates with the front chamber 202. According the configuration, the other suction fan 203 also communicates with the common front chamber 202 and suctions the outside air G via the common filter 201, and thereby, even when the other suction fan 203 is used, the clogging of the filter 201 may be measured.

The projector 1000 of the embodiment includes the exterior housing 100 taking in the outside air G via the filter 201, the light source 401 placed in the exterior housing 100, the image forming unit 600 placed in the exterior housing 100 and converting the light from the light source 401 into the image light, the suction fan 203 placed in the exterior housing 100 and having the intake opening 203x taking in the outside air G, the front chamber 202 placed in the exterior housing 100 and communicating with the filter 201 and the intake opening 203x, the pressure sensor 204 placed in the front chamber 202, and the control unit 10 drive-controlling the suction fan 203. The control unit 10 executes the first measurement processing of driving the suction fan 203, and setting the pressure of the front chamber 202 to negative pressure, and measuring the pressure by the pressure sensor 204, the second measurement processing of driving the suction fan 203, setting the pressure of the front chamber 202 to the pseudo-outside air pressure, and measuring the pressure by the pressure sensor 204, and the determination processing of determining clogging of the filter 201 based on the difference between the pressure value of the first measurement processing and the pressure value of the second measurement processing.

According to the configuration, the pressure value on which the clogging condition of the filter 201 is reflected may be measured by the first measurement processing, the pressure value close to the pressure of the outside air G may be measured by the second measurement processing, and the clogging of the filter 201 may be determined based on the difference between the two pressure values by the determination processing. Further, the pressure sensor 204 is placed in the front chamber 202 and the pressure value of the front chamber 202 as a restricted region is measured, and thereby, compared to a case where the pressure value of the entire exterior housing 100 is measured, the time before the pressure becomes constant is shorter and the pressure value may be measured earlier.

As below, a modified example of the above described embodiment will be explained.

As described above, when clogging is sensed, not limited to the change of the driving method of the suction fans 203, but, for example, announce processing of prompting the user to replace or clean the filter 201 may be performed. The announce processing includes announcing using the display unit 17 of the projector 1000 and announcing to a connecting device by wireless means. Note that display using an LED or notification by sound using the sound output unit 18 may be employed.

What is claimed is:

1. A projector comprising:
an exterior housing taking in outside air via a filter;
a light source placed in the exterior housing;
an image forming apparatus placed in the exterior housing and converting a light from the light source into an image light;
a suction fan placed in the exterior housing and having an intake opening taking in the outside air;
a front chamber placed in the exterior housing and communicating with the filter and the intake opening;
a pressure sensor placed in the front chamber; and
a control unit drive-controlling the suction fan, wherein the control unit executes
first measurement processing of activating the suction fan and measuring pressure of the front chamber at a rotation number at the activation by the pressure sensor,
second measurement processing of setting the rotation number of the suction fan to a rotation number lower than the rotation number at the activation and measuring the pressure of the front chamber by the pressure sensor, and
determination processing of determining clogging of the filter based on a difference between a pressure value of the first measurement processing and a pressure value of the second measurement processing.

2. The projector according to claim 1, wherein
when determining clogging does not occur in the determination processing, the control unit sets normal driving of the suction fan and drives the suction fan at a normal drive rotation number higher than the rotation number in the second measurement processing, and
when determining clogging occurs in the determination processing, the control unit sets clogging driving of the suction fan and drives the suction fan at a clogging drive rotation number higher than the normal drive rotation number.

3. The projector according to claim 2, wherein
when clogging is determined in the determination processing, the control unit drives the suction fan at a rotation number higher than the clogging drive rotation number, and then, reduces the rotation number to the clogging drive rotation number.

4. The projector according to claim 1, wherein
the control unit turns on a light from the light source after the activation of the suction fan and before the first measurement processing and executes the second measurement processing in a stable drive period of the light source.

5. The projector according to claim 1, wherein
the control unit has a threshold for determination of a high altitude and a low altitude, and
when determining the high altitude by comparison between the pressure value of the second measurement processing and the threshold, the control unit drives the suction fan at a rotation number higher than a rotation number at the low altitude.

6. The projector according to claim 1, wherein
the image forming apparatus has a light modulation panel,
the suction fan has an ejection opening, and
the ejection opening and the light modulation panel are coupled by a duct.

7. The projector according to claim 1, further comprising another suction fan different from the suction fan, wherein
the other suction fan has another intake opening, and
the other intake opening communicates with the front chamber.

8. A projector comprising:
an exterior housing taking in outside air via a filter;
a light source placed in the exterior housing;
an image forming apparatus placed in the exterior housing and converting a light from the light source into an image light;
a suction fan placed in the exterior housing and having an intake opening taking in the outside air;
a front chamber placed in the exterior housing and communicating with the filter and the intake opening;
a pressure sensor placed in the front chamber; and
a control unit drive-controlling the suction fan, wherein the control unit executes
first measurement processing of driving the suction fan, setting pressure of the front chamber to negative pressure, and measuring the pressure by the pressure sensor,
second measurement processing of driving the suction fan, setting the pressure of the front chamber to pseudo-outside air pressure, and measuring the pressure by the pressure sensor, and
determination processing of determining clogging of the filter based on a difference between a pressure value of the first measurement processing and a pressure value of the second measurement processing.

* * * * *